(12) United States Patent
Kim et al.

(10) Patent No.: US 9,299,726 B2
(45) Date of Patent: Mar. 29, 2016

(54) DISPLAY DEVICE HAVING AN OVERLAPPING LOW REFLECTION CONDUCTIVE LINE

(71) Applicant: Samsung Display Co., Ltd., Yongin (KR)

(72) Inventors: Hyungjune Kim, Anyang-si (KR); YeoGeon Yoon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/337,978

(22) Filed: Jul. 22, 2014

(65) Prior Publication Data
US 2015/0129985 A1    May 14, 2015

(30) Foreign Application Priority Data

Nov. 13, 2013  (KR) ........................ 10-2013-0137808

(51) Int. Cl.
*H01L 27/12* (2006.01)
*H01L 29/78* (2006.01)
*H01L 29/786* (2006.01)

(52) U.S. Cl.
CPC ........ *H01L 27/124* (2013.01); *H01L 29/78633* (2013.01)

(58) Field of Classification Search
CPC ................................................... H01L 27/124
See application file for complete search history.

(56) References Cited

U.S. PATENT DOCUMENTS

| 5,994,721 | A | 11/1999 | Zhong et al. |
| 6,982,181 | B2* | 1/2006 | Hideo ............... G02F 1/136277 438/30 |
| 7,079,210 | B2* | 7/2006 | Um .................... G02F 1/133345 349/122 |
| 7,511,779 | B2 | 3/2009 | Chae et al. |
| 7,535,520 | B2 | 5/2009 | Yoon et al. |
| 7,602,452 | B2 | 10/2009 | Kato et al. |
| 7,697,096 | B2* | 4/2010 | Choi ...................... G02F 1/1337 349/129 |
| 7,965,370 | B2* | 6/2011 | Matsumori ......... G02F 1/13363 349/158 |
| 7,968,002 | B2* | 6/2011 | Lyu ................... G02F 1/133707 252/299.01 |
| 8,045,072 | B2 | 10/2011 | Ahn |
| 8,482,689 | B2 | 7/2013 | Nakahara et al. |
| 9,019,453 | B2* | 4/2015 | Rho .................. G02F 1/134309 349/123 |
| 9,041,869 | B2* | 5/2015 | Kim et al. ....................... 349/12 |

(Continued)

FOREIGN PATENT DOCUMENTS

JP        2007101896      4/2007
KR     1020040036987     5/2004

(Continued)

*Primary Examiner* — Ida M Soward
(74) *Attorney, Agent, or Firm* — H.C. Park & Associates, PLC

(57) ABSTRACT

A display apparatus includes a first base substrate that includes an upper surface and a lower surface facing the upper surface and includes a transmission area and a light blocking area, a low reflection conductive line disposed on the lower surface of the first base substrate, in which a portion of the lower reflection conductive line is overlapped with the transmission area to transmit a portion of an incident light, a second base substrate facing the lower surface of the first base substrate, and a pixel disposed between the first and second base substrates, at least a portion of the pixel being overlapped with the transmission area.

12 Claims, 7 Drawing Sheets

(56) References Cited

U.S. PATENT DOCUMENTS

| | | | |
|---|---|---|---|
| 2004/0195573 A1* | 10/2004 | Kim | G02F 1/136227 257/72 |
| 2006/0001803 A1* | 1/2006 | Park | 349/113 |
| 2007/0211194 A1* | 9/2007 | Cho | G02F 1/133516 349/106 |
| 2011/0122330 A1 | 5/2011 | Tae et al. | |
| 2011/0255045 A1 | 10/2011 | Son et al. | |
| 2013/0135193 A1* | 5/2013 | Fike et al. | 345/156 |
| 2015/0002936 A1* | 1/2015 | Jun | G02B 1/116 359/492.01 |

FOREIGN PATENT DOCUMENTS

| | | |
|---|---|---|
| KR | 1020070072111 | 7/2007 |
| KR | 1020080028571 | 4/2008 |

* cited by examiner

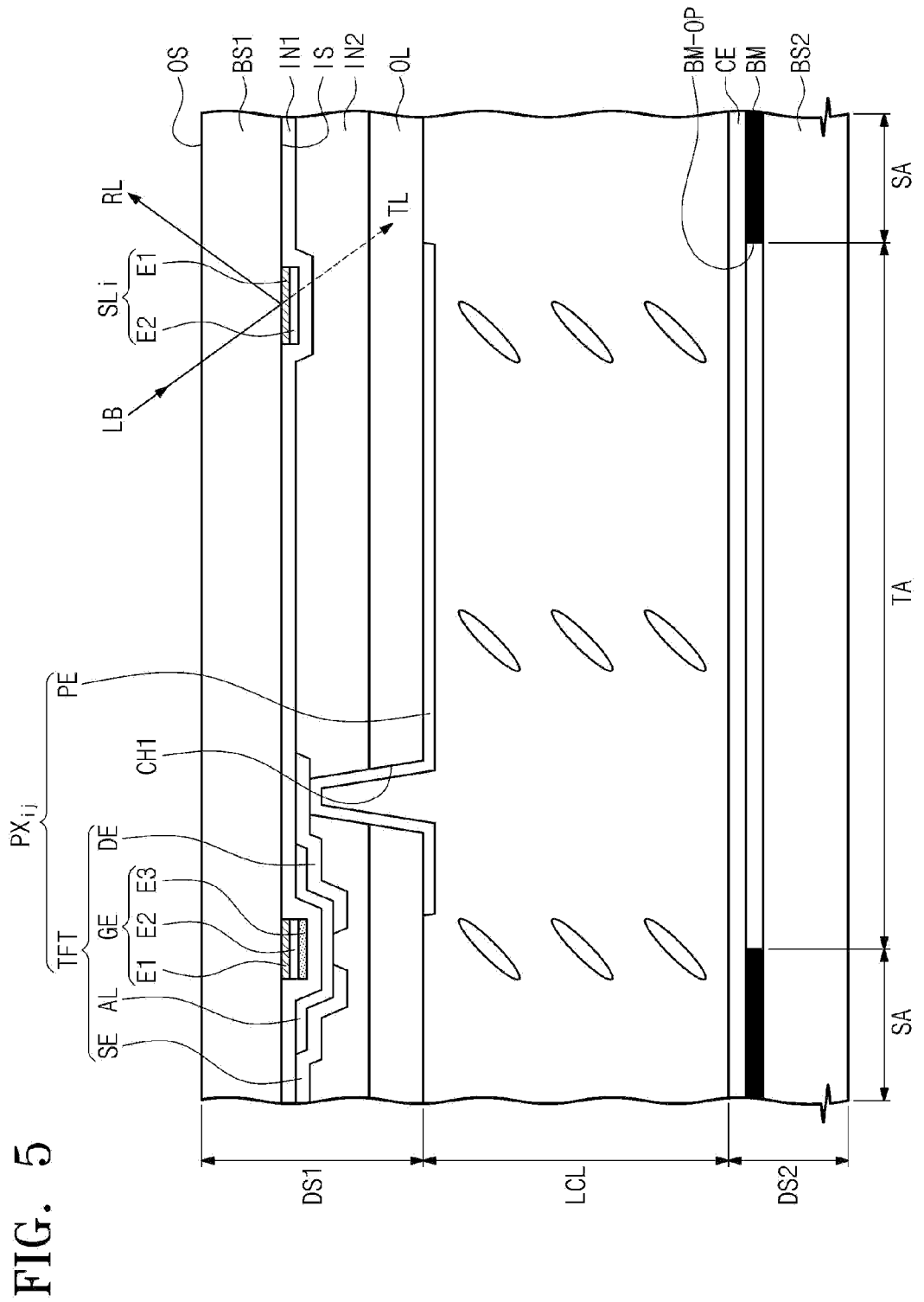

DISPLAY DEVICE HAVING AN OVERLAPPING LOW REFLECTION CONDUCTIVE LINE

CROSS REFERENCE TO RELATED APPLICATION

This application claims priority from and the benefit of Korean Patent Application No. 10-2013-0137808, filed on Nov. 13, 2013, which is hereby incorporated by reference for all purposes as if fully set forth herein.

BACKGROUND

1. Field

Exemplary embodiments of the present disclosure relate to a display panel. More particularly, the present disclosure relates to a display panel having improved display quality.

2. Discussion of the Background

A flat panel display device has been developed to replace a cathode ray tube display device since cathode ray tube displays are thick and consume high amounts of power. For use as a flat panel display device, display devices such as an organic light emitting display device, a liquid crystal display device, a plasma display panel device, and others have been suggested.

The display devices include pixels, and signal lines to apply signals to the pixels. Each pixel includes a thin film transistor connected to a corresponding signal line. Each pixel is driven in response to a data voltage provided by the corresponding signal line, and, thus, images are displayed.

SUMMARY

Exemplary embodiments of the present invention provide a display panel capable of reducing external incident reflection to improve display quality.

Additional features of the invention will be set forth in the description which follows, and in part will be apparent from the description, or may be learned by practice of the invention.

An exemplary embodiment of the inventive concept discloses a display panel including a first base substrate that includes an upper surface and a lower surface facing the upper surface and includes a transmission area and a light blocking area, a low reflection conductive line disposed on the lower surface of the first base substrate, in which a portion of the lower reflection conductive line being overlapped with the transmission area to transmit a portion of an incident light, a second base substrate facing the lower surface of the first base substrate, and a pixel disposed between the first and second base substrates, at least a portion of the pixel being overlapped with the transmission area. The low reflection conductive line includes a metal layer disposed on the lower surface of the first base substrate and having a thickness to transmit the portion of the incident light and a transparent conductive oxide layer disposed on the metal layer.

According to the above, the conductive line disposed in the area overlapped with the transmission area includes the low reflection conductive line including the metal layer with the thickness for the transmissivity. Thus, the reflectance of the external light incident to the display panel may be reduced. In this manner, although the conductive line is disposed in the transmission area, the aperture ratio of the pixel may be prevented from being lowered and the display quality of the display panel may be improved.

It is to be understood that both the foregoing general description and the following detailed description are exemplary and explanatory and are intended to provide further explanation of the invention as claimed.

BRIEF DESCRIPTION OF THE DRAWINGS

The above and other advantages of the present disclosure will become readily apparent by reference to the following detailed description when considered in conjunction with the accompanying drawings.

FIG. 5 is a cross-sectional view showing a display panel according to another exemplary embodiment of the present disclosure.

DETAILED DESCRIPTION OF THE ILLUSTRATED EMBODIMENTS

Figure 1:
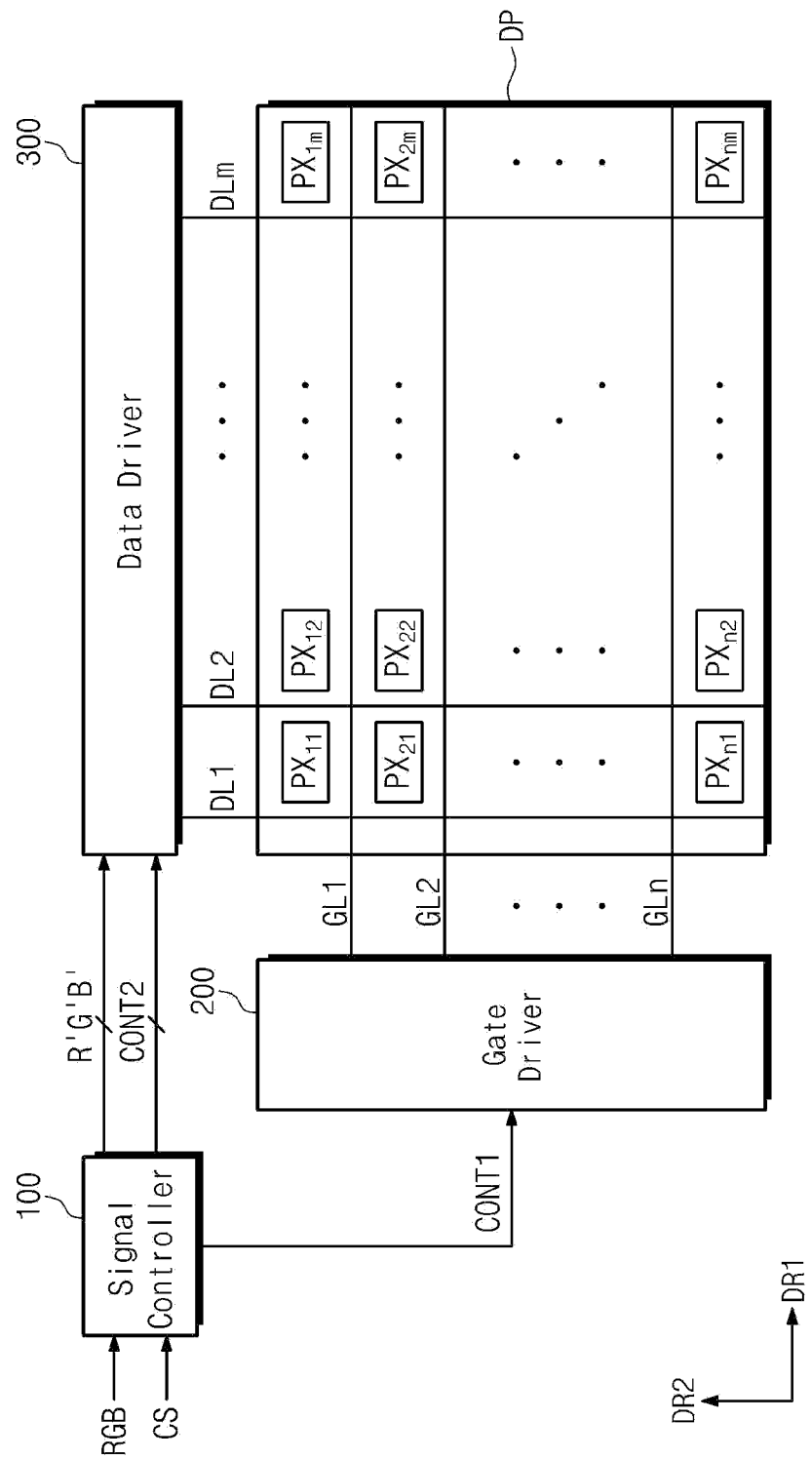
FIG. 1 is a block diagram showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

Figure 2:
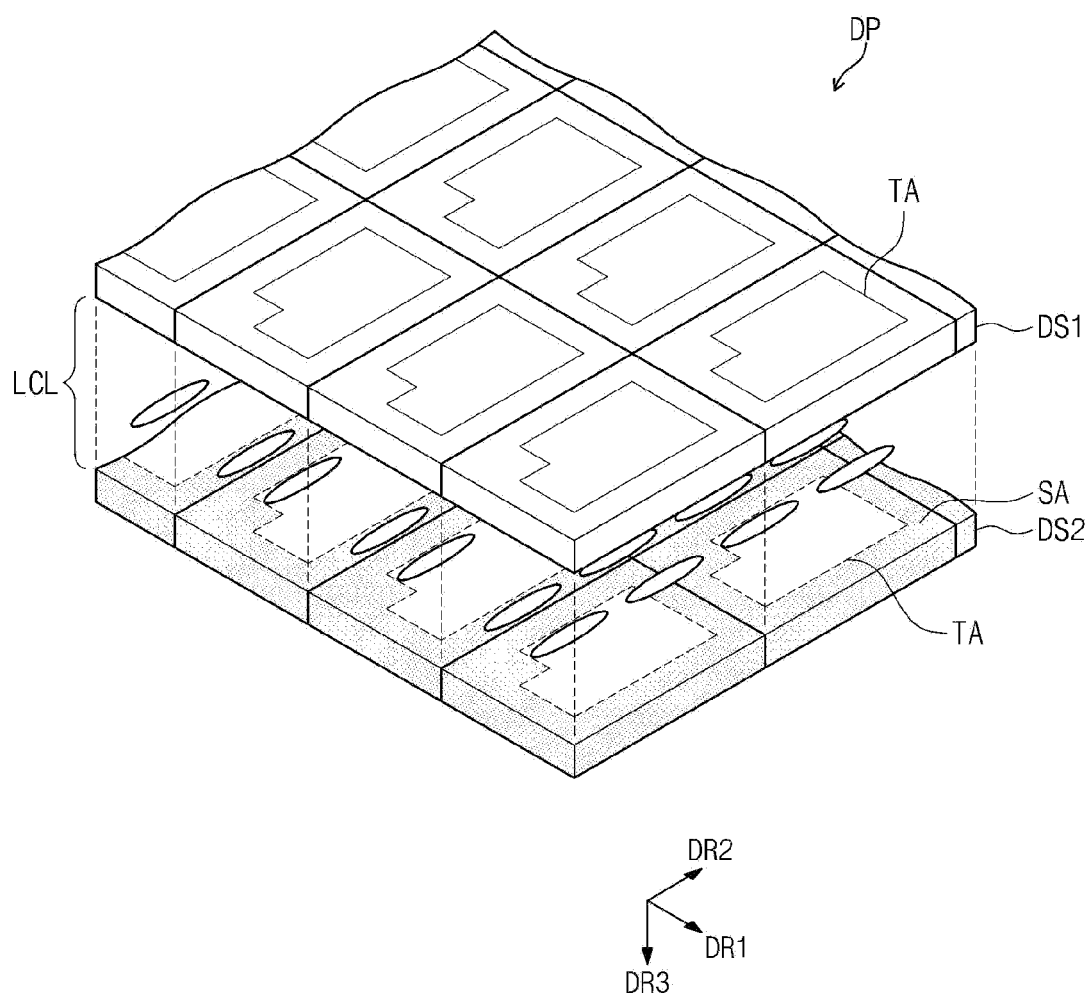
FIG. 2 is a perspective view showing a portion of the display panel shown in FIG. 1.

FIG. 1 is a block diagram showing a display device according to an exemplary embodiment of the present disclosure and FIG. 2 is a perspective view showing a portion of the display panel shown in FIG. 1.

The display device includes a display panel DP, a signal controller 100, a gate driver 200, and a data driver 300. The display panel DP may be a liquid crystal display panel, an organic light emitting display panel, an electrophoretic display panel, or an electrowetting display panel, but it is limited thereto.

In the present exemplary embodiment, a liquid crystal display device employing the liquid crystal display panel will be described as the exemplary display device. The liquid crystal display panel DP includes two display substrates DS1 and DS2 and a liquid crystal layer LCL disposed between the two display substrates DS1 and DS2.

Although not shown in figures, the liquid crystal display device may further include a backlight unit (not shown) to supply light to the liquid crystal display panel DP, and a pair of polarizing plates (not shown). The liquid crystal display panel DP may be, for example, a vertical alignment (VA) mode liquid crystal display panel, a patterned vertical alignment (PVA) mode liquid crystal display panel, an in-plane switching (IPS) mode liquid crystal display panel, a fringe-field switching (FFS) mode liquid crystal display panel, or a plane to line switching mode liquid crystal display panel, but it is not be limited thereto. In the present exemplary embodiment, the VA mode liquid crystal display panel will be described as a representative example.

The display panel DP includes a plurality of signal lines and a plurality of pixels PX11 to PXnm connected to the signal lines. The signal lines include a plurality of gate lines GL1 to GLn and a plurality of data liens DL1 to DLm. The gate lines GL1 to GLn extend in a first direction DR1 and are arranged in a second direction DR2 to be disposed substantially perpendicular to the gate lines GL1 to GLn. The data lines DL1 to DLm are insulated from the gate lines GL1 to GLn and cross the gate lines GL1 to GLn.

The pixels PX11 to PXnm are arranged in a matrix form. Each of the pixels PX11 to PXnm is connected to a corresponding gate line of the gate lines GL1 to GLn and a corresponding data line of the data lines DL1 to DLm.

The gate lines GL1 to GLn, the data lines DL1 to DLm, and the pixels PX11 to PXnm are disposed on the first display substrate DS1, which is disposed above the liquid crystal layer LCL. The second display substrate DS2 is spaced apart from the first display substrate DS1 in a thickness direction DR3 (hereinafter, referred to as a third direction). The second display substrate DS2 includes a black matrix BM (refer to FIG. 4).

The display panel DP includes a plurality of transmission areas TA and a light blocking area SA disposed adjacent to the transmission areas TA. The transmission areas TA may transmit the light generated by and provided from the backlight unit. The light blocking area SA may block the light provided from the backlight unit.

Although not shown in figures, the display panel DP may include a display area and a non-display area surrounding the display area when viewed in a plan view. The image may not be displayed in the non-display area. The non-display area may be disposed along an edge of the display panel DP and include a portion of the light blocking area SA. The image may be displayed in the display area. The display area may include the transmission areas TA and a portion of the light blocking area SA disposed between the transmission areas TA.

The gate lines GL1 to GLn and the data lines DL1 to DLm are disposed to overlap with the light blocking area SA. The pixels PX11 to PXnm are disposed to respectively correspond to the transmission areas TA. As described later in this description, the transmission area TA and the light blocking area SA are defined by a color filter layer.

The signal controller 100 receives input image signals RGB and converts the input image signals RGB to image data R'G'B' appropriate to an operation of the display panel DP. The signal controller 100 may receive various control signals, such as a vertical synchronization signal, a horizontal synchronization signal, a main clock signal, and a data enable signal, and outputs first and second control signals CONT1 and CONT2.

The gate driver 200 applies gate signals to the gate lines GL1 to GLn in response to the first control signal CONT1. The first control signal CONT1 may include a vertical start signal to start an operation of the gate driver 200, a gate clock signal to determine an output timing of a gate voltage, and an output enable signal to determine an ON-pulse width of the gate voltage.

The data driver 300 receives the second control signal CONT2 and the image data R'G'B'. The data driver 300 converts the image data R'G'B' to data voltages and applies the data voltages to the data lines DL1 to DLm.

The second control signal CONT2 may include a horizontal start signal to start an operation of the data driver 300, an inversion signal to invert a polarity of the data voltages, and an output indication signal to determine an output timing of the data voltages from the data driver 300.

Figure 3:
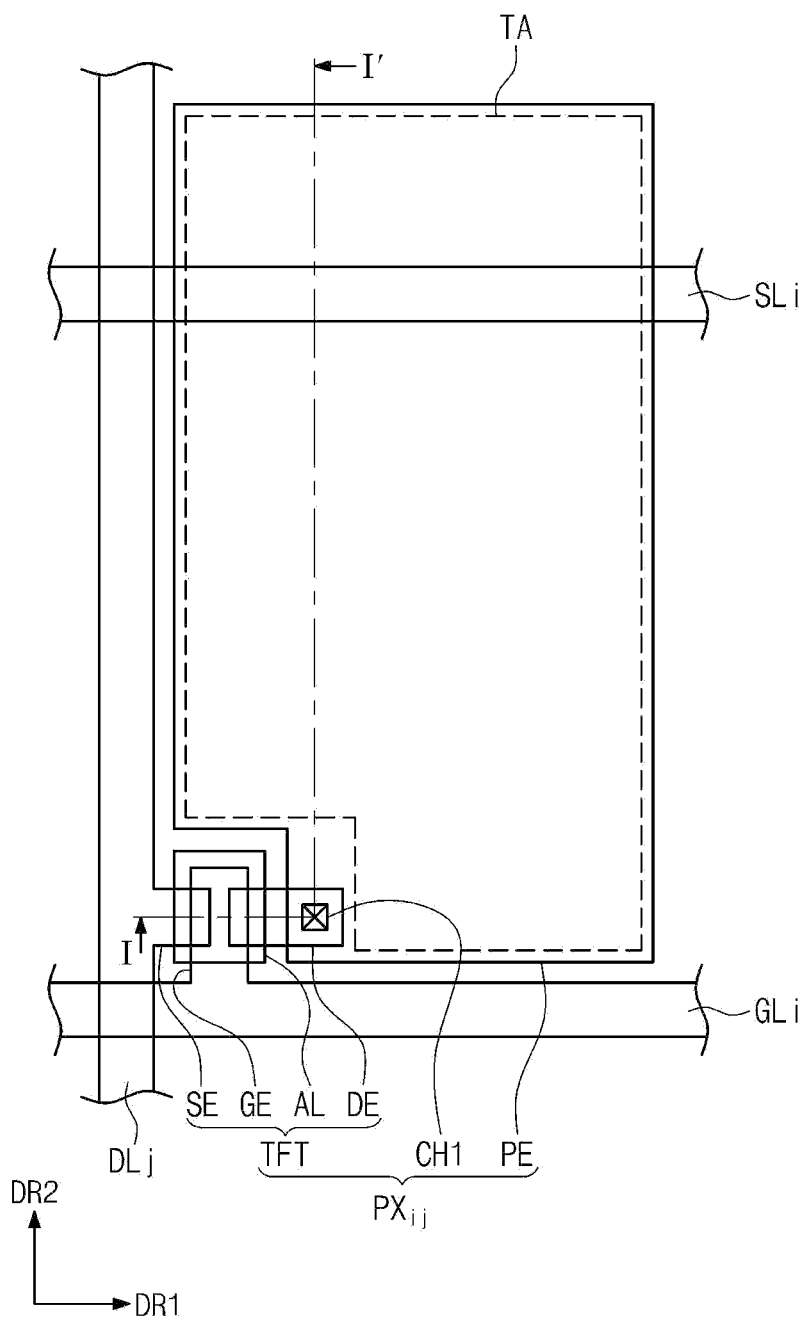
FIG. 3 is a plan view showing a pixel according to an exemplary embodiment of the present disclosure.
Figure 4:
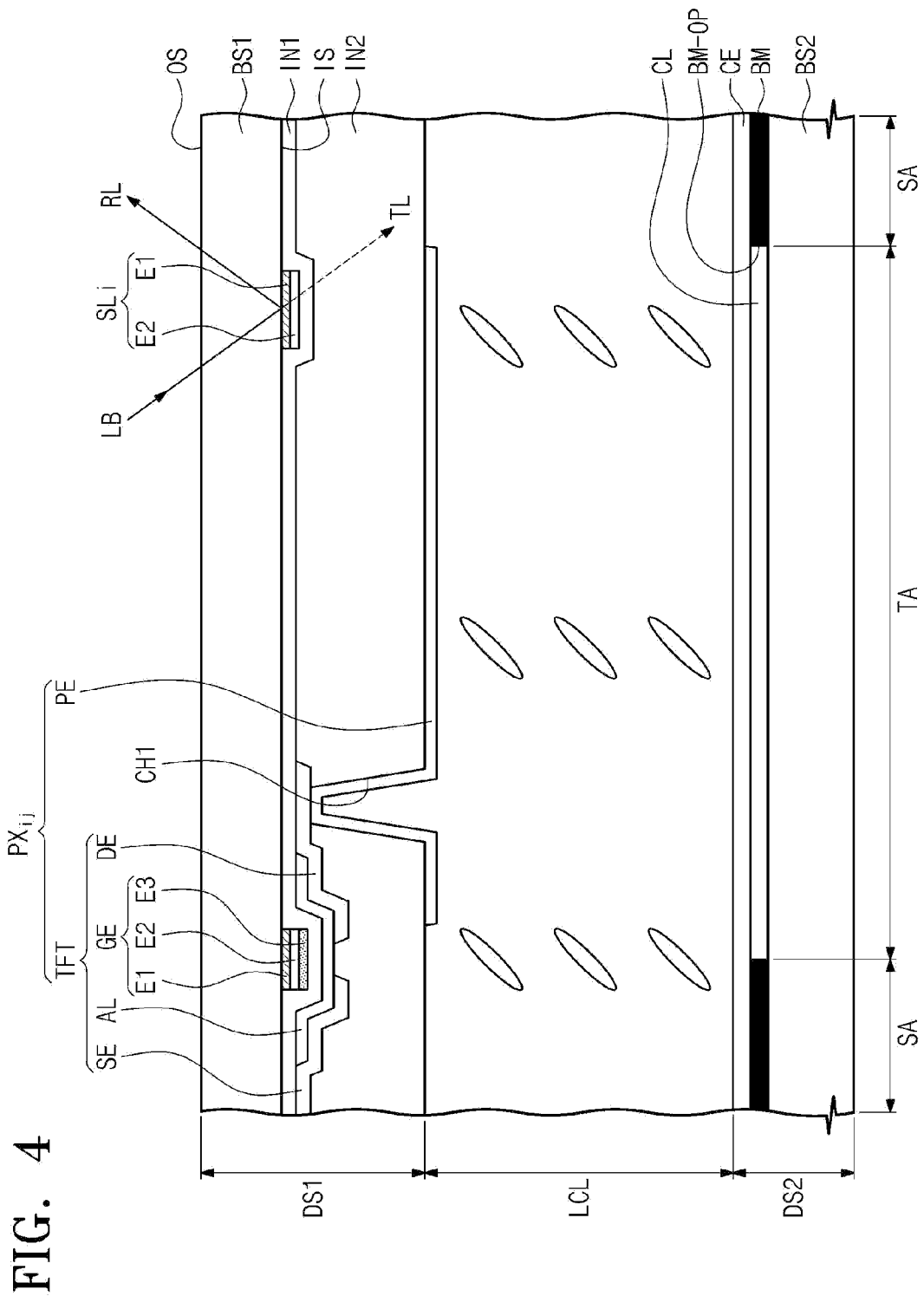
FIG. 4 is a cross-sectional view taken along a line I-I' of FIG. 3.

FIG. 3 is a plan view showing the pixel according to an exemplary embodiment of the present disclosure and FIG. 4 is a cross-sectional view taken along a line I-I' of FIG. 3. FIG. 3 shows only one pixel PXij as a representative example, but the configuration of the pixel PXij should not be limited to that shown in FIG. 3.

Referring to FIGS. 3 and 4, the first display substrate DS1 includes a first base substrate BS1, a gate line GLi, a data line DLj, a plurality of insulating layers IN1 and IN2, and a pixel PXij. The gate line GLi, the data line DLj, the insulating layers IN1 and IN2, and the pixel PXij are disposed on an inner surface IS of the first base substrate BS1. The first base substrate BS1 is disposed such that an outer surface thereof is recognized at the outside of the first base substrate BS1. An external light is incident to the outer surface OS. The first base substrate BS1 may be a transparent substrate, e.g., a glass substrate, a plastic substrate, a silicon substrate, etc.

The first display substrate DS1 includes the low reflection conductive line SLi. FIGS. 3 and 4 show only one low reflection conductive line SLi, but the display panel DP may include a plurality of low reflection conductive lines corresponding to the gate lines GL1 to GLn. In this case, the low reflection conductive lines extend in the first direction DR1 and are arranged in the second direction DR2. The low reflection conductive lines are spaced apart from the gate lines GL1 to GLn.

The low reflection conductive line SLi partially overlaps with the transmission area TA. In the present exemplary embodiment, the low reflection conductive line SLi is disposed to cross the transmission area TA, but it should not be limited thereto. That is, the low reflective conductive line SLi may be disposed to overlap with an edge of the transmission area TA.

In the present exemplary embodiment, the low reflection conductive line SLi may be referred to as a storage line. The low reflection conductive line SLi may form a storage capacitor (not shown) with the pixel electrode PE. The storage capacitor is connected to a liquid crystal capacitor in parallel. The storage capacitor maintains the data voltage applied to each pixel at a uniform level for an amount of time.

As shown in FIG. 4, the low reflection conductive line SLi includes a transmissive metal layer E1 and a transparent conductive oxide layer E2. The metal layer E1 is disposed on the inner surface IS of the first base substrate BS1.

The metal layer E1 has a thickness smaller than or equal to a critical thickness that will be described later. The metal layer E1 transmits a portion of the incident light through the first base substrate BS1. The metal layer E1 reflects a portion of the light incident thereto to generate a reflection light RL.

The metal layer E1 may comprise various metals. For example, the metal layer E1 may comprise aluminum, silver, copper, molybdenum, chromium, tantalum, titanium, or alloy thereof.

The transparent conductive oxide layer E2 is disposed on the metal layer E1. The transparent conductive oxide layer E2 transmits the light exiting from the metal layer E1 to generate a transmission light TL.

The transparent conductive oxide layer E2 may include at least one of indium zinc oxide, indium tin oxide, indium gallium oxide, or indium gallium zinc oxide, but is limited thereto. The transparent conductive oxide layer E2 has a refractive index that depends on the oxide material included therein. A refraction degree of the light is changed according to a thickness of the transparent conductive oxide layer E2. The thickness of the transparent conductive oxide layer E2 determined by the oxide material included therein and the metal layer E1. A thickness of the transparent conductive oxide layer E2 that minimizes reflectance of the low reflection conductive line SLi is used.

As described above, the low reflection conductive line SLi has a double-layer structure of the metal layer E1 and the transparent conductive oxide layer E2, so the amount of the light RL reflected in the transmission area TA may be reduced. Accordingly, the reflectance of the display panel is decreased and negative qualities caused by reflection of the external light on the display panel are reduced.

The pixel PXij includes the thin film transistor TFT and the pixel electrode PE. The pixel electrode PE is disposed to overlap with the transmission area TA and the thin film transistor TFT is disposed to overlap with the light blocking area SA, but the configuration is not be limited thereto. That is, the thin film transistor TFT may be disposed to overlap with the transmission area TA.

The gate electrode GE and the gate line GLi of the thin film transistor TFT are disposed on the inner surface IS of the first base substrate BS1. The gate electrode GE is connected to the gate line GLi. The gate electrode GE may include the same material as the gate line GLi and has the same structure as the gate line GLi. The following description will be described according to an exemplary embodiment wherein the gate electrode GE and the gate line GLi include the same material and have the same structure.

The gate electrode GE and the gate line GLi may include a low reflection material. For instance, the gate electrode GE and the gate line GLi may include at least one of titanium, indium zinc oxide, indium tin oxide, copper, and alloys thereof. Alternatively, the gate electrode GE and the gate line GLi may include a multi-layer structure of at least one of the above-mentioned materials.

In the present exemplary embodiment, the gate electrode GE includes first to third layers E1 to E3 sequentially stacked on the inner surface of the first base substrate BS1. The first layer E1 is substantially the same layer as the metal layer of the low reflection conductive line SLi and the second layer E2 is substantially the same layer as the transparent conductive oxide layer of the low reflection conductive line SLi. The third layer E3 is a conductive layer formed of a metal material and may have a conductivity higher than that of the first layer E1.

Although not shown in figures, the gate line GLi, the gate electrode GE, and the low reflection conductive line SLi may be substantially simultaneously patterned through the same single process. For instance, the gate line GLi having a triple-layer structure and the low reflection conductive line SLi having the double-layer structure may be formed by selectively etching plural conductive layers.

The gate electrode GE, including the first to third layers E1 to E3, may have a low reflectance with respect to incident light radiated onto gate electrode GE.

A first insulating layer IN1 is disposed on the gate electrode GE. The first insulating layer IN1 includes a plurality of insulating layers. The first insulating layer IN1 insulates the gate electrode GE from other elements. The first insulating layer IN1 may serve as a gate insulating layer.

The first insulating layer IN1 covers the gate electrode GE, the gate line GLi, and the low reflection conductive line SLi. Although not shown in figures, the first insulating layer IN1 may have a multi-layer structure according to embodiments. The first insulating layer IN1 may include an organic or inorganic material. For instance, the first insulating layer IN1 may include a silicon inorganic material. The silicon inorganic material may include at least one of silicon oxide and silicon nitride.

The data line DLj is disposed on the first insulating layer IN1. The data line DLj may include at least one of copper, titanium, aluminum, and alloys thereof. The data line DLj may have a multi-layer structure including different metal layers.

A source electrode SE of the thin film transistor TFT is connected to the data line DLj. The source electrode SE may include the same material and the same layer structure as the data line DLj.

A semiconductor layer AL is disposed on the first gate insulating layer IN1 to overlap with the gate electrode GE. The source electrode SE is disposed on the first insulating layer IN1 and a drain electrode DE of the thin film transistor TFT is disposed on the first insulating layer IN1 spaced apart from the source electrode SE. The source electrode SE and the drain electrode DE overlap with portions of the semiconductor layer AL, respectively.

A second insulating layer IN2 is disposed on the first insulating layer IN1 and the thin film transistor TFT. The second insulating layer IN2 may include a passivation layer and/or a planarization layer. The second insulating layer IN2 may include an organic or inorganic material. The second insulating layer IN2 covers the thin film transistor TFT.

The pixel electrode PE is disposed on the second insulating layer IN2. The pixel electrode PE overlaps with the transmission area TA. The pixel electrode PE is connected to the drain electrode DE of the thin film transistor TFT through a contact hole CH1 formed through the second insulating layer IN2. Although not shown in figures, a protective layer (not shown) and an alignment layer (not shown) may be further disposed on the pixel electrode PE to protect the pixel electrode PE.

The second display substrate DS2 is disposed under the first display substrate DS1. The second display substrate DS2 includes a second base substrate BS2, a black matrix BM, and a common electrode CE. The second base substrate DS2 may include the same material as the first base substrate BS1, but is not be limited thereto.

The black matrix BM includes a plurality of openings BM-OP. The black matrix BM defines the light blocking area SA and the openings BM-OP define the transmission areas TA. The black matrix BM overlaps the gate lines, the data lines, and the thin film transistor.

A color filter CL including an organic material with a predetermined color is disposed in each opening BM-OP. According to another embodiment, the black matrix BM may be included in the first display substrate DS1.

The black matrix BM blocks the light generated by the backlight unit from entering the areas in which the gate line GLi and the data line DLj are disposed. In addition, the black matrix BM prevents external light incident from traveling to the outside of the first display substrate DS1 after being reflected by the second base substrate BS2.

The common electrode CE is disposed on the black matrix BM. The common electrode CE is disposed facing the pixel electrode PE. The common electrode CE forms an electric field with the pixel electrode PE. The common electrode CE is disposed over an entire surface of the second base substrate BS2. Although not shown in figures, a protective layer (not shown) and an alignment layer (not shown) may be further disposed on the common electrode CE to protect the common electrode CE.

Although not shown in figures, according to another embodiment, the common electrode CE may be disposed on the first display substrate DS1. In detail, the common electrode CE may be disposed on the same layer as the pixel electrode PE. In this case, the common electrode CE may be alternately arranged with the pixel electrode PE and insulated from the pixel electrode PE, or the common electrode CE may be disposed above the pixel electrode PE.

The liquid crystal layer LCL is disposed between the first and second display substrates DS1 and DS2. The liquid crystal layer LCL is sealed between the first and second display substrates DS1 and DS2 by a spacer (not shown). The liquid crystal layer LCL includes directors having directional properties. The electric field formed between the pixel electrode PE and the common electrode CE controls the directional property of the directors.

The thin film transistor TFT outputs the data voltage applied to the data line DLj in response to the gate signal applied to the gate line GLi. The pixel electrode PE receives a pixel voltage corresponding to the data voltage. The common electrode CE receives a common voltage. The pixel electrode PE and the common electrode CE form a vertical electric field. The vertical electric field changes an arrangement of the directors included in the liquid crystal layer LCL.

Although not shown in figures, according to another embodiment in which the common electrode CE is disposed on the first display substrate DS1, the pixel electrode PE and the common electrode CE form a horizontal electric field. The arrangement of the directors included in the liquid crystal layer LCL may be changed by the horizontal electric field. In this case, the pixel electrode PE or the common electrode CE may include a plurality of slits (not shown).

FIG. 5 is a cross-sectional view showing a display panel according to another exemplary embodiment of the present disclosure. In FIG. 5, the same reference numerals denote the same elements in FIGS. 1 to 4, and thus detailed descriptions of the same elements will be omitted.

Referring to FIG. 5, the display panel includes a first display substrate DS1, a second display substrate DS2, and a liquid crystal layer LCL sealed between the first display substrate DS1 and the second display substrate DS2. The first display substrate DS1 has substantially the same structure as the display panel shown in FIG. 4 except that the first display substrate DS1 further includes an organic layer OL.

The organic layer OL is disposed between the second insulating layer IN2 and the pixel electrode PE. In the present exemplary embodiment, the organic layer OL may be referred to as a color filter layer. The color filter layer OL includes at least one color. For instance, the color filter layer OL may have a red, blue, green, white, cyan, magenta, or yellow color. The color filter layer OL may have different colors depending on position of the transmission area TA. In addition, the color filter layer OL is disposed on the second insulating layer IN2 to planarize an upper surface of the second insulating layer IN2.

The pixel electrode PE is connected to the thin film transistor TFT through a contact hole CH1 formed through the color filter layer OL and the second insulating layer IN2. Although not shown in figures, a protective layer (not shown) and an alignment layer (not shown) may be further disposed on the pixel electrode PE.

The second display substrate DS2 is disposed under the first display substrate DS1. When the organic layer OL of the first display substrate DS1 is used as the color filter, the color filter may be omitted from the second display substrate DS2 when compared to the display panel shown in FIG. 4. The liquid crystal layer LCL is disposed between the first and second display substrates DS1 and DS2. The liquid crystal layer LCL may be sealed between the first and second display substrates DS1 and DS2 by a seal pattern. The second display substrate DS2 and the liquid crystal layer LCL have the same structure and function as those of the second display substrate and the liquid crystal layer shown in FIGS. 1 to 4, and thus details thereof will be omitted.

Figure 6A:
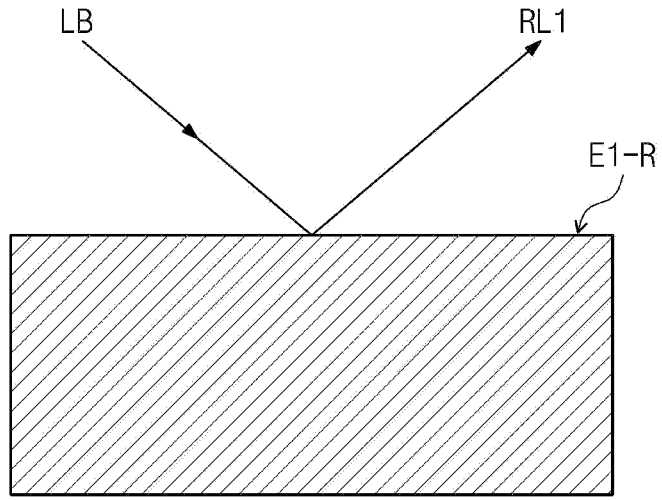
FIGS. 6A and 6B are views showing a path of an incident light in accordance with a thickness of a metal layer according to an exemplary embodiment of the present disclosure.
Figure 6B:
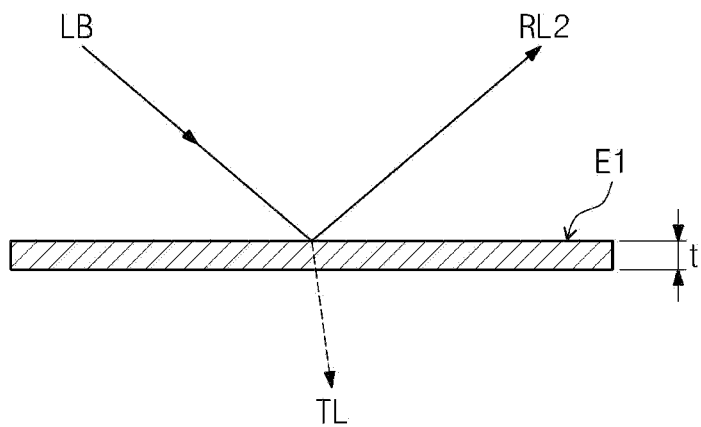

FIGS. 6A and 6B are views showing a path of the incident light in accordance with a varying thickness of the metal layer E1 according to an exemplary embodiment of the present disclosure. In detail, FIG. 6A shows the path of the incident light according to a non-transmissive metal layer E1-R and FIG. 6B show the path of the incident light according to the metal layer E1 having the critical thickness t1.

Referring to FIG. 6A, the non-transmissive metal layer E1-R reflects most of the incident light LB to generate the reflection light RL1. In general, the metal material has a non-transmissivity to the light and high reflectance. Accordingly, the metal layer including the metal material blocks and reflects the incident light.

But a portion of the incident light sometimes can go through the metal layer according to a thickness of the metal layer. Generally, the smaller the thickness of the metal layer is, the higher the transmittance of the metal layer. As shown in FIG. 6B, however, the metal layer E1 having the critical thickness t1 has transmissivity. That is, the metal layer E1 having transmissivity may be formed by adjusting the thickness of the metal layer including the metal material with the non-transmissivity.

The critical thickness t1 means a thickness of which at least a portion of incident light penetrates the metal layer E1. The critical thickness t1 corresponds to a maximum thickness at which the metal layer has transmissivity. For instance, the thickness t1 is a thickness of which metal layer has a transmissivity of 1%.

The incident light LB is incident to the metal layer E1 and partially transmits through the metal layer E1, and thus, the transmission light TL and the reflection light RL2 are generated. The reflection light RL2 corresponds to a portion of the incident light LB, which remains after the other portion of the incident light LB transmits through the metal layer E1. Therefore, an amount of the reflection light RL2 is smaller than that of the reflection light RL1 generated by the non-transmissive metal layer E1-R. As described above, the low reflection conductive layer SLi according to the present exemplary embodiment includes the metal layer E1 having the thickness smaller than the critical thickness t1, and thus, the reflectance on the surface of the low reflection conductive layer SLi may be reduced.

According to exemplary embodiments of the present invention, the metal layer E1 has the thickness less than or equal to the maximum thickness of the metal layer E1 having critical thickness t1. When the metal layer E1 has a thickness greater than the critical thickness t1, the metal layer E1 is non-transmissive and reflects most of the incident light LB. The transmissivity of the metal layer E1 increases on the condition that the metal layer E1 has the thickness equal to or smaller than the critical thickness t1.

The thickness of the metal layer E1 influences not only the transmissivity of the metal layer E1 but also on the conductivity of the metal layer E1. The minimum thickness of the metal layer E1 is related to the conductivity of the metal layer E1. As the thickness of the metal layer E1 becomes smaller, a resistance value of the metal layer E1 becomes higher and the conductivity of the metal layer E1 becomes lower.

In the present exemplary embodiment, since the low reflection conductive line SLi is a signal line applied with a voltage, the resistance value exerts influence on the operation of the thin film transistor TFT. Thus, metal layer E1 has a minimum thickness. For instance, when the metal layer E1 includes titanium (Ti), the metal layer E1 may have a thickness of about 10 angstroms to about 130 angstroms, considering variation in conductivity according to the thickness of titanium (Ti).

As described above, the display panel according to the present exemplary embodiment may include the metal layer E1 having a thickness that improves the transmittance thereof and does not exert influence on the display quality of the display panel. The maximum thickness and the minimum thickness of the metal layer E1 are determined depending on the kind of the material included in the metal layer E1. That is, the critical thickness of the metal layer E1 allowing the metal layer E1 to have the transmissivity and the variation in resistance according to the thickness is changed according to the material used. For instance, when the metal layer E1 includes titanium (Ti), the metal layer E1 has the transmissivity at the thickness equal to or smaller than about 130 angstroms.

Figure 7A:
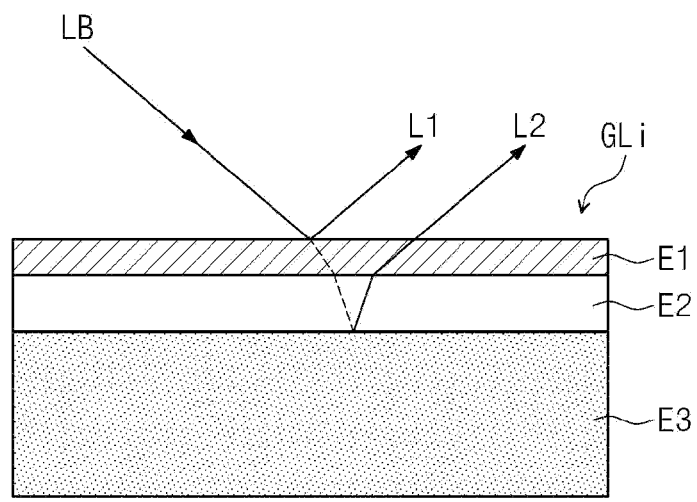
FIG. 7A is a view showing a path of light caused by a gate line according to an exemplary embodiment of the present disclosure.
Figure 7B:
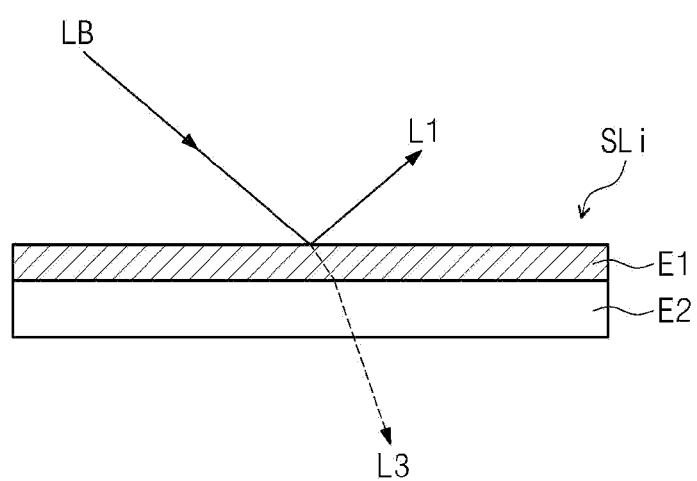
FIG. 7B is a view showing a path of light caused by a low reflection conductive line according to an exemplary embodiment of the present disclosure.

FIG. 7A is a view showing a path of light caused by the gate line according to an exemplary embodiment of the present disclosure and FIG. 7B is a view showing a path of the light caused by the low reflection conductive line according to an exemplary embodiment of the present disclosure.

Referring to FIG. 7A, the incident light LB partially transmits through and is partially reflected by the metal layer E1, and thus, a first reflection light L1 is generated. The amount of the first reflection light L1 is smaller than that of the incident light LB.

The light transmitting through the metal layer E1 is incident to the transparent conductive oxide layer E2 and most of the light transmits through the transparent conductive oxide layer E2. The transparent conductive oxide layer E2 has a refractive index varied depending on the material thereof, but has transmissivity. Therefore, the transparent conductive oxide layer E2 transmits most of the light incident thereto.

The light transmitting through the transparent conductive oxide layer E2 is incident to and reflected by the conductive layer E3. In contrast to the metal layer E1, the conductive layer E3 may have a thickness determined without considering of the transmissivity. Thus, most of the light incident to the conductive layer E3 is reflected by the conductive layer E3.

The light reflected by the conductive layer E3 transmits through the transparent conductive oxide layer E2, and the light transmitting through the transparent conductive oxide layer E2 partially transmits through and is reflected by the metal layer E1, and thus a second reflection light L2 traveling to the outside of the gate line GLi is generated. The second reflection light RL2 corresponds to the sum of the reflection lights except for the first reflection light L1.

The amount of the first reflection light L1 and the second reflection light L2 is lesser than that of the incident light LB by the metal layer E1 and the transparent conductive oxide layer E2. As described above, since the gate line GLi according to the present exemplary embodiment includes the metal layer E1 and the transparent conductive oxide layer E2, the gate line GLi has the reflectance lower than that when the gate line GLi includes only the conductive layer E3.

The characteristic of the low reflectance of the gate line GLi according to the current embodiment is improved when compared to a case where the gate line GLi has the single-layer structure of the conductive layer E3, but the reflectance of the gate line GLi may be higher than that of the low reflection storage line SLi. Because the gate line GLi may receive a pulse voltage, the gate line GLi is greatly influenced by a line resistance thereof since a polarity of the pulse voltage may be inverted according to certain time intervals.

The line resistance delays charging and discharging time when the polarity of the pulse voltage is changed. Accordingly, the gate line GLi applied with the pulse voltage may affect a response speed of the image displayed in the display panel in accordance with the conductivity. As the resistance of the gate line GLi becomes higher, the response speed becomes slower, e.g., an RC delay phenomenon. Therefore, the gate line GLi includes the conductive layer E3 having high conductivity.

Referring to FIG. 7B, the incident light LB incident to the low reflection conductive line SLi partially transmits through and is reflected by the metal layer E1, and, thus, the first reflection light L1 is generated. The amount of the first reflection light L1 is smaller than that of the incident light LB.

The light transmitting through the metal layer E1 is incident to the transparent conductive oxide layer E2 and most of the light transmits through the transparent conductive oxide layer E2. The transparent conductive oxide layer E2 has the refractive index varied depending on the material thereof, but has transmissivity. Therefore, the low reflection conductive layer SLi generates the transmission light TL.

The reflection light L1 reflected by the low reflection conductive line SLi corresponds to the first reflection light L1 reflected by the gate line GLi. The low reflection conductive line SLi does not generate the second reflection light L2 when compared to the gate line GLi.

In contrast to the gate line GLi, the low reflection conductive line SLi receives a direct-current voltage. The direct-current voltage has constant polarity and voltage level. Since the voltage is charged or discharged when the polarity is changed, the charging and discharging time may be delayed when the line resistance becomes higher. In addition, since the polarity of the direct current voltage is constant, deterioration in current driving capability is not severe after an initial time point at which a power source voltage is applied. Thus, the conductivity of the low reflection conductive line SLi is lowered, but the transmissivity of the low reflection conductive line SLi is improved, thereby reducing the light reflectance in the transmission area TA and improving the display quality of the display panel.

The low reflection conductive line SLi includes the metal layer E1 and the transparent conductive oxide layer E2, and thus an aperture ratio of the display panel may be improved. In addition, since the low reflection conductive line SLi overlaps the transmission area TA, the aperture ratio may be lowered when the conductive layer E3 having high conductivity but non-transparent properties is used. The display panel according to the present exemplary embodiment includes the low reflection conductive line SLi configured to include the metal layer E1 and the transparent conductive oxide layer E2. Accordingly, the reflectance to the incident light is lowered and the aperture ratio is improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display panel, comprising:
   a first substrate comprising an upper surface and a lower surface opposite to the upper surface and further comprising a transmission area and a light blocking area adjacent to the transmission area;
   a low reflection conductive line disposed on the lower surface of the first substrate, a portion of the lower reflection conductive line overlapping with the transmission area, the low reflection conductive line configured to transmit a portion of an incident light;
   a second substrate facing the lower surface of the first substrate; and
   a pixel, at least a portion of the pixel overlapping with the transmission area, the low reflection conductive line comprising:
   a metal layer disposed on the lower surface of the first substrate comprising a thickness configured to transmit the portion of the incident light; and
   a transparent conductive oxide layer disposed on the metal layer.

2. The display panel of claim 1, wherein the metal layer comprises titanium.

3. The display panel of claim 2, wherein the metal layer comprises thickness in a range of 10 angstroms to 130 angstroms.

4. The display panel of claim 3, further comprising:
   an insulating layer disposed on the lower surface of the first substrate, the metal layer, and the transparent conductive oxide layer.

5. The display panel of claim 4, wherein a sidewall of the metal layer is coplanar with a sidewall of the transparent conductive oxide layer.

6. The display panel of claim 4, wherein the low reflection conductive line is configured to receive a direct-current voltage.

7. The display panel of claim 6, wherein the pixel comprises:
   a thin film transistor disposed on the lower surface of the first substrate and overlapping with the light blocking area; and
   a pixel electrode disposed in the transmission area, overlapping with the low reflection conductive line, and electrically connected to the thin film transistor.

8. The display panel of claim 7, further comprising:
   a first signal line disposed on the lower surface of the first substrate, overlapping with the light blocking area, and electrically connected to the thin film transistor; and
   a second signal line disposed in the light blocking area, insulated from the first signal line to cross the first signal line, and electrically connected to the thin film transistor, and
   wherein the first signal line and the second signal line are insulated by the insulating layer that covers the low reflection conductive line.

9. The display panel of claim 8, wherein the gate line comprises:
   a light-transmissive first layer disposed on the lower surface of the first substrate;
   a light-transmissive second layer disposed on the first layer; and
   a third layer disposed on the second layer and having a conductivity higher than a conductivity of the first layer, and
   wherein the first layer of the first signal line and the metal layer of the low reflection conductive line comprise the same material, and
   wherein the second layer of the first signal line and the transparent conductive oxide layer of the low reflection conductive line comprise the same material.

10. The display panel of claim 7, further comprising:
    a color filter layer disposed between the thin film transistor and the pixel electrode.

11. The display panel of claim 7, further comprising:
    a black matrix disposed on the second substrate, the black matrix comprising an opening overlapping the transmission area; and
    a common electrode disposed on the black matrix configured to form an electric field with the pixel electrode.

12. The display panel of claim 11, wherein the opening is filled with an organic material comprising a color.

* * * * *